(12) United States Patent
Ryu et al.

(10) Patent No.: US 11,004,712 B2
(45) Date of Patent: May 11, 2021

(54) METHOD OF INSPECTING SEMICONDUCTOR WAFER, INSPECTION SYSTEM FOR PERFORMING THE SAME, AND METHOD OF FABRICATING SEMICONDUCTOR DEVICE USING THE SAME

(71) Applicant: Samsung Electronics Co., Ltd., Suwon-si (KR)

(72) Inventors: Sung Yoon Ryu, Suwon-si (KR); Joonseo Song, Seoul (KR); Souk Kim, Seoul (KR); Younghoon Sohn, Incheon (KR); Yusin Yang, Seoul (KR); Chihoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/532,920

(22) Filed: Aug. 6, 2019

(65) Prior Publication Data
US 2020/0176292 A1   Jun. 4, 2020

(30) Foreign Application Priority Data
Dec. 4, 2018 (KR) .................... 10-2018-0154559

(51) Int. Cl.
*H01L 21/67* (2006.01)
*G01B 11/24* (2006.01)
*G06T 7/00* (2017.01)

(52) U.S. Cl.
CPC ........ *H01L 21/67288* (2013.01); *G01B 11/24* (2013.01); *G06T 7/001* (2013.01); *G06T 2207/30148* (2013.01)

(58) Field of Classification Search
CPC ............. H01L 21/67288; G01B 11/24; G06T 2207/30148; G06T 7/001; G06T 7/0044; G06T 7/60
See application file for complete search history.

(56) References Cited

U.S. PATENT DOCUMENTS

| | | | | |
|---|---|---|---|---|
| 5,737,072 A | * | 4/1998 | Emery | ............. G01N 21/95607 356/237.2 |
| 6,583,634 B1 | * | 6/2003 | Nozoe | .................. G01R 31/307 324/754.22 |

(Continued)

FOREIGN PATENT DOCUMENTS

| KR | 10-2008-0061938 A | 7/2008 |
|---|---|---|
| KR | 10-2016-0087197 A | 7/2016 |

*Primary Examiner* — Sang H Nguyen
(74) *Attorney, Agent, or Firm* — Harness, Dickey & Pierce, P.L.C.

(57) ABSTRACT

Disclosed are methods of inspecting semiconductor wafers, inspection systems for performing the same, and methods of fabricating semiconductor devices using the same. A method of inspecting a semiconductor wafer including preparing a wafer including zones each having patterns, obtaining representative values for the patterns, scanning the patterns under an optical condition to obtain optical signals for the patterns, each of the optical signals including optical parameters, selecting a representative optical parameter that is one of the optical parameters that has a correlation with the representative values, obtaining a reference value of the representative optical parameter for a reference pattern, and obtaining a defect of an inspection pattern by comparing the reference value with an inspection value of the representative optical parameter for the inspection pattern.

20 Claims, 8 Drawing Sheets

(56) References Cited

U.S. PATENT DOCUMENTS

| | | |
|---|---|---|
| 7,180,584 B2 | 2/2007 | Maeda et al. |
| 7,379,173 B2 | 5/2008 | Fairley et al. |
| 9,470,640 B2 | 10/2016 | Matsumoto et al. |
| 9,645,094 B2 | 5/2017 | Honda et al. |
| 9,859,138 B2 | 1/2018 | Davis |
| 2005/0045821 A1* | 3/2005 | Noji ........................ H01J 37/05 250/311 |
| 2006/0039598 A1* | 2/2006 | Kim ................. G01N 21/95607 382/145 |
| 2009/0037134 A1* | 2/2009 | Kulkarni ............ G01N 21/9501 702/127 |
| 2009/0080759 A1* | 3/2009 | Bhaskar .................... G06T 1/20 382/141 |
| 2010/0074516 A1* | 3/2010 | Kawaragi ............... G06T 7/001 382/149 |
| 2014/0205180 A1* | 7/2014 | Chung ................. G06T 7/0006 382/149 |
| 2015/0109435 A1* | 4/2015 | Ito .................... G01N 21/95607 348/126 |
| 2015/0324965 A1* | 11/2015 | Kulkarni ................ G01B 21/16 382/144 |

\* cited by examiner

METHOD OF INSPECTING SEMICONDUCTOR WAFER, INSPECTION SYSTEM FOR PERFORMING THE SAME, AND METHOD OF FABRICATING SEMICONDUCTOR DEVICE USING THE SAME

CROSS-REFERENCE TO RELATED APPLICATION

This U.S. non-provisional application claims priority under 35 U.S.C § 119 to Korean Patent Application No. 10-2018-0154559 filed on Dec. 4, 2018 in the Korean Intellectual Property Office, the entire contents of which are hereby incorporated by reference.

BACKGROUND

The present inventive concepts relate to methods of inspecting a semiconductor wafer, inspection systems for performing the same, and/or methods of fabricating a semiconductor device using the same.

Semiconductor devices may be manufactured by various fabrication processes such as photolithography, etching, deposition, ion implantation, and cleaning. After performing the fabrication processes for manufacturing semiconductor devices, an inspection process may be executed to determine whether or not defects are present on patterns included in semiconductor devices. Such inspection process may optimize conditions of the fabrication processes by ascertaining defects of semiconductor devices at an early stage. With the high integration of semiconductor devices, patterns of semiconductor device become increasingly finer and inspection methods and/or systems having improved reliability are desired.

SUMMARY

Some example embodiments of the present inventive concepts provide inspection methods and/or systems capable of easily detecting defects due to process variations.

Some example embodiments of the present inventive concepts provide methods of fabricating a semiconductor device, which can reduce or minimize the occurrence of defects.

According to an example embodiment of the present inventive concepts, a method of inspecting a semiconductor wafer may include preparing a wafer including a plurality of zones, the wafer including a plurality of patterns on the plurality of zones, respectively, obtaining a plurality of representative values for the patterns, scanning the patterns under a first optical condition to obtain a plurality of first optical signals for the patterns, each of the first optical signals including a plurality of optical parameters, selecting a representative optical parameter among the optical parameters, the representative optical parameter being one of the optical parameters that has a correlation with the representative values equal to or greater than a threshold correlation, obtaining a reference value of the representative optical parameter for a reference pattern, and obtaining a defect of an inspection pattern by comparing the reference value with an inspection value of the representative optical parameter for the inspection pattern.

According to an example embodiment of the present inventive concepts, a semiconductor wafer inspection system may include a stage configured to load a wafer including a plurality of patterns, a light source configured to emit an incident light on the wafer, a detector configured to detect a reflected light from the wafer, and a processor configured to store and process an optical signal of the reflected light. The optical signal may include a plurality of optical parameters, and the processor may be configured to store a plurality of representative values for the patterns and select one of the optical parameters as a representative optical parameter, the representative optical parameter being one of the optical parameters that has a correlation with the representative values equal to or greater than a threshold correlation.

According to an example embodiment of the present inventive concepts, a method of fabricating a semiconductor device may include forming a plurality of patterns on a wafer, loading the wafer having the patterns formed thereon onto a stage of an inspection system, scanning the patterns under a specific optical condition to obtain a plurality of inspection optical signals of the patterns, detecting a defect of each of the patterns based on a reference optical signal and an inspection optical signal, from among the inspection optical signals, that corresponds to the each of the patterns, determining whether or not a level of the detected defect is within an allowable range, and performing subsequent processes to fabricate a semiconductor device on the wafer, in response to the level of the detected defect being within the allowable range. Each of the reference optical signal and the inspection optical signals may include a plurality of optical parameters. The detecting may include obtaining an inspection value of a representative optical parameter from the inspection optical signal of each of the patterns, the representative optical parameter being one pre-selected from the optical parameters, obtaining a reference value of the representative optical parameter from the reference optical signal, and creating a defect signal by comparing the inspection value and the reference value.

DETAILED DESCRIPTION

Some example embodiments of the present inventive concepts will be described below in detail with reference to the accompanying drawings.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

Figure 1:
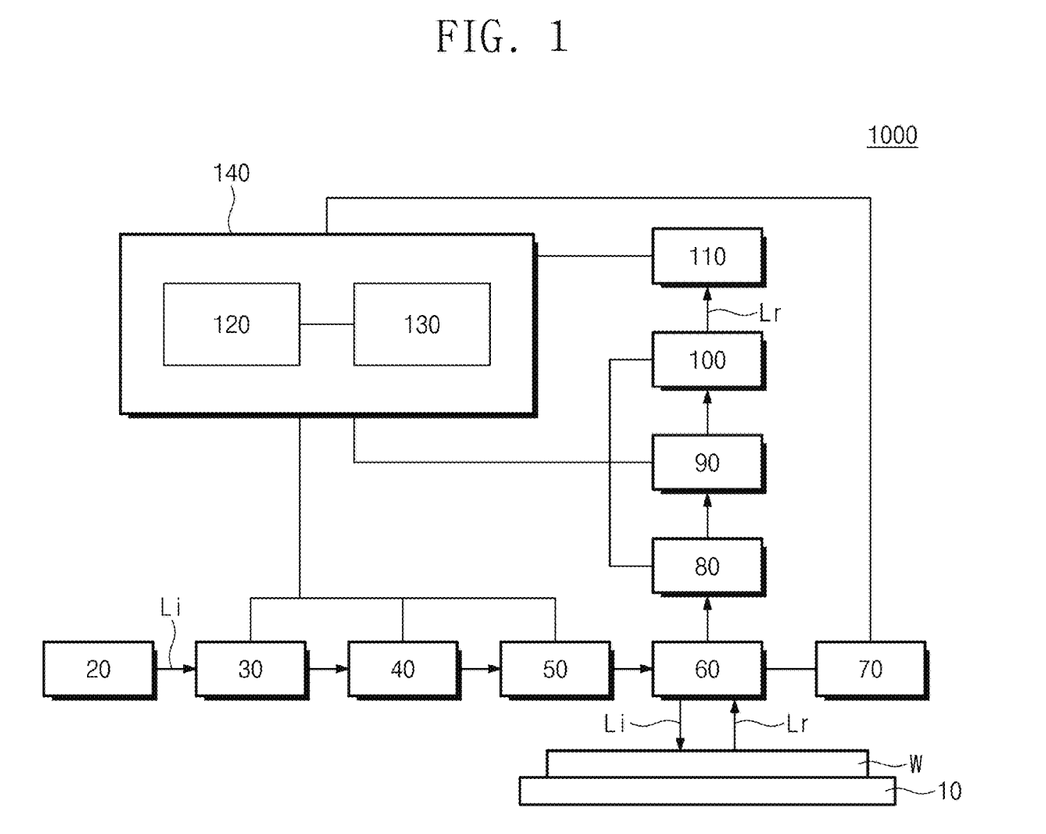
FIG. 1 illustrates a simplified schematic diagram showing an inspection system according to an example embodiment of the present inventive concepts.

FIG. 1 illustrates a simplified schematic diagram showing an inspection system according to an example embodiment of the present inventive concepts.

Referring to FIG. 1, an inspection system 1000 may include a stage 10 that loads a wafer W, a light source 20 that emits an incident light Li irradiated to the wafer W, and a detector 110 that detects a reflected light Lr reflected from the wafer W. The inspection system 1000 may include a first spatial filter 30 that spatially filters the incident light Li, a spectral filter 40 that adjusts a wavelength of the incident light Li, a first polarizer filter 50 that adjusts a polarization of the incident light Li, a second polarizer filter 80 that adjusts a polarization of the reflected light Lr, a second spatial filter 90 that spatially filters the reflected light Lr, and a tube lens 100 and an objective lens 60 that adjusts an optical magnification of the inspection system 1000. The inspection system 1000 may include an autofocus 70 configured to adjust a focal plane of the incident light Li.

The inspection system 1000 may further include a computer system 140 that includes a processor 120 and a controller 130. The processor 120 may be configured to store and process various instructions and/or data. For example, the processor 120 may store and process optical signals of the reflected light Lr, which are detected by the detector 110. The controller 130 may be configured to control operations of the first and second spatial filters 30 and 90, the spectral filter 40, the first and second polarizer filters 50 and 80, the tube lens 100, and the autofocus 70. The controller 130 may be configured to change optical conditions of the incident light Li and the reflected light Lr by altering operations of one or more of the first and second spatial filters 30 and 90, the spectral filter 40, the first and second polarizer filters 50 and 80, the tube lens 100, and the autofocus 70. The processor 120 and the controller 130 may be connected to each other through a data bus. The inspection system 1000 may be used for a non-destructive test.

The processor 120 and/or the controller 130 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The following describes a method of inspecting a semiconductor wafer using the inspection system 1000.

Figure 2:
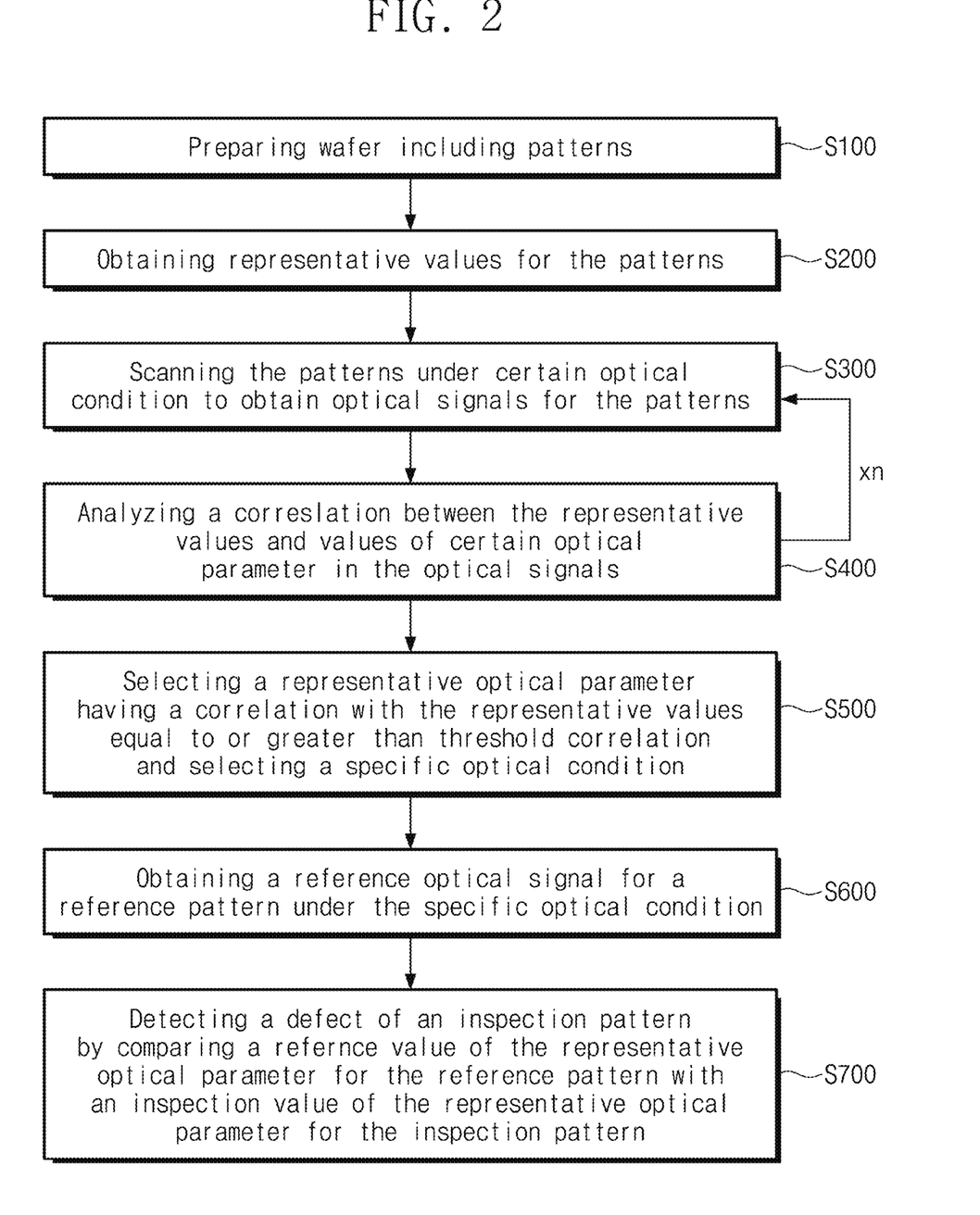
FIG. 2 illustrates a flow chart showing a method of inspecting a semiconductor wafer according to an example embodiment of the present inventive concepts.
Figure 5:
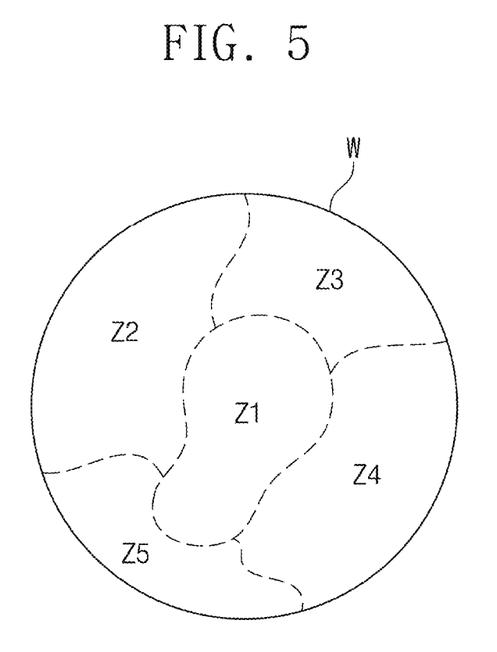
FIGS. 5, 6, and 9 illustrate conceptual diagrams associated with a method of inspecting a semiconductor wafer according to an example embodiment of the present inventive concepts.
Figure 6:
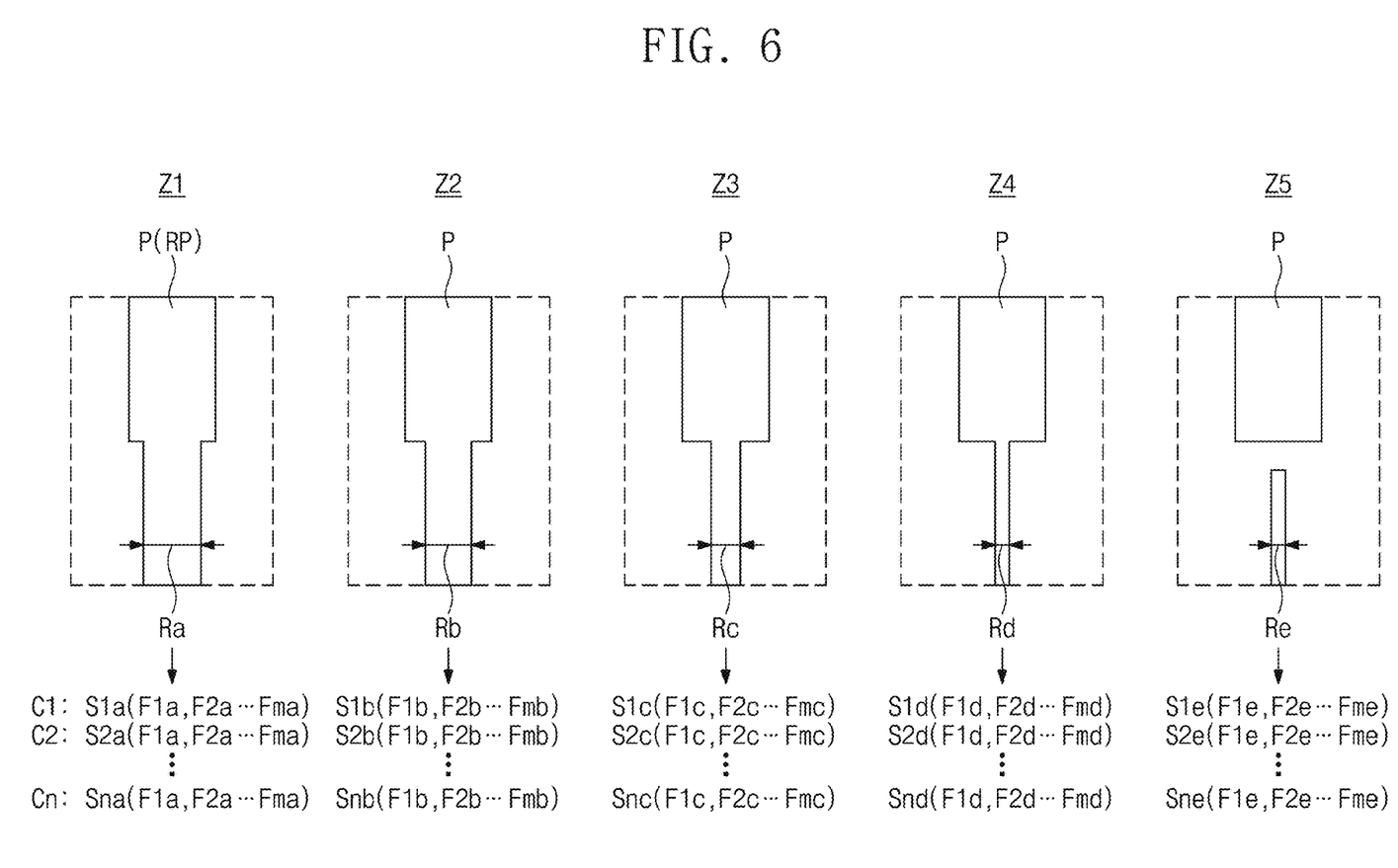

[m1]Referring to FIGS. 2, 5, and 6, a wafer W may be prepared to include patterns P (S100). The wafer W may include a plurality of zones Z1, Z2, Z3, Z4, and Z5, and the patterns P may be correspondingly provided on the plurality of zones Z1, Z2, Z3, Z4, and Z5. At least one of the patterns P (for example, a pattern P on a zone Z5) may have a structural defect (e.g., pattern cut-off or pattern bridge) caused by one or more fabrication processes (e.g., photolithography or etching). For brevity of description, the following will describe an example in which the patterns P are formed on a single wafer W, but differently from that shown, the patterns P may be correspondingly formed on a plurality of wafers W.

Representative values Ra, Rb, Rc, Rd, and Re for the patterns P may be obtained (S200). The representative values Ra, Rb, Rc, Rd, and Re may relate to physical factors (size, shape, material, etc.) of the patterns P or results of an electrical die sorting (EDS) test (e.g., yield data) for semiconductor chips including the patterns P. For example, the representative values Ra, Rb, Rc, Rd, and Re may be critical dimensions (CDs) of the patterns P. The representative values Ra, Rb, Rc, Rd, and Re of the patterns P may be stored in the processor 120 of the inspection system 1000 shown in FIG. 1, and the wafer W including the patterns P may be loaded on the stage 10 of the inspection system 1000.

Figure 7:
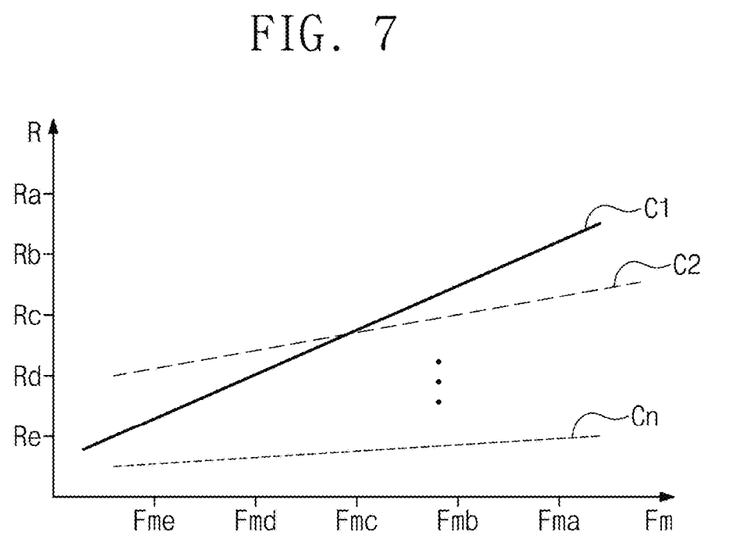
FIG. 7 illustrates a graph showing a correlation between values of an optical parameter and representative values of patterns shown in FIG. 6.

Referring to FIGS. 2, 6, and 7, the patterns P may be scanned under an optical condition to obtain optical signals for the patterns P (S300). The optical signals may correspond to optical images of the patterns P, and a respective one of the optical signals may include a plurality of optical parameters that provide information about the optical image of a corresponding one of the patterns P. The plurality of optical parameters may include, for example, intensity or gray level of light reflected from each of the patterns P.

For example, the inspection system 1000 of FIG. 1 may scan the patterns P under a first optical condition C1. To scan the patterns P under the first optical condition C1, the controller 130 of the inspection system 1000 may control operations of one or more of the first and second spatial filters 30 and 90, the spectral filter 40, the first and second polarizer filters 50 and 80, the tube lens 100, and the autofocus 70. The scanning of the patterns P under the first optical condition C1 may obtain first optical signals S1$a$, S1$b$, S1$c$, S1$d$, and S1$e$ for the patterns P. The first optical signals S1$a$, S1$b$, S1$c$, S1$d$, and S1$e$ may be obtained from the corresponding patterns P. The first optical signals S1$a$, S1$b$, S1$c$, S1$d$, and S1$e$ may correspond to optical images of the patterns P under the first optical condition C1. Each of the first optical signals S1$a$, S1$b$, S1$c$, S1$d$, and S1$e$ may include a plurality of optical parameters F1, F2, . . . , and Fm. The plurality of optical parameters F1, F2, . . . , and Fm may provide information about the optical image of each of the patterns P. The detector 110 of FIG. 1 may be configured to obtain the first optical signals S1$a$, S1$b$, S1$c$, S1$d$, and S1$e$ from the patterns P, and the processor 120 of FIG. 1 may be configured to store the first optical signals S1$a$, S1$b$, S1$c$, S1$d$, and S1$e$ that are obtained by the detector 110.

An operation may be performed to analyze a correlation between the representative values Ra, Rb, Rc, Rd, and Re of the patterns P and values of one optical parameter in the optical signals (S400).

Figure 3:
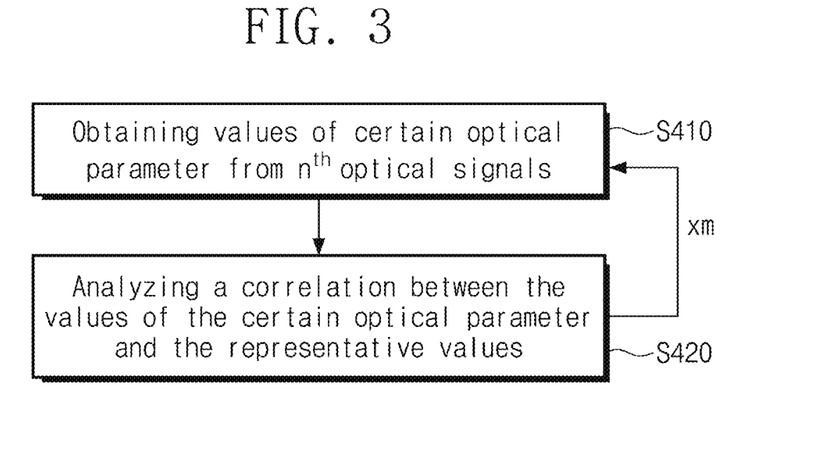
FIG. 3 illustrates a flow chart showing in detail an operation S400 of FIG. 2.

For example, referring to FIGS. 3, 6, and 7, an operation may be performed to obtain values of one optical parameter from the optical signals (S410), and an operation may be performed to analyze a correlation between the values of the optical parameter and the representative values Ra, Rb, Rc, Rd, and Re of the patterns P (S420). In certain example embodiments, the processor 120 of FIG. 1 may be configured to extract values Fma, Fmb, Fmc, Fmd, and Fme of one optical parameter Fm from the first optical signals S1a, S1b, S1c, S1d, and S1e, and to analyze a correlation between the representative values Ra, Rb, Rc, Rd, and Re of the patterns P and the values Fma, Fmb, Fmc, Fmd, and Fme of the optical parameter Fm. FIG. 7 illustrates an example of the correlation, under the first optical condition C1, between the representative values Ra, Rb, Rc, Rd, and Re of the patterns P and the values Fma, Fmb, Fmc, Fmd, and Fme of the optical parameter Fm.

Under the first optical condition C1, the processor 120 may be configured to analyze the correlation between the representative values Ra, Rb, Rc, Rd, and Re of the patterns P and values of each of the plurality of optical parameters F1, F2, ..., and Fm. In this case, the operations S410 and S420 of FIG. 3 may be repeatedly performed "m" times. For example, the processor 120 may extract values F1a, F1b, F1c, F1d, and F1e of a first optical parameter F1 among the plurality of optical parameters F1, F2, ..., and Fm from the first optical signals S1a, S1b, S1c, S1d, and S1e, and may analyze a correlation between the representative values Ra, Rb, Rc, Rd, and Re of the patterns P and the values F1a, F1b, F1c, F1d, and F1e of the first optical parameter F1. The processor 120 may extract values F2a, F2b, F2c, F2d, and F2e of a second optical parameter F2 among the plurality of optical parameters F1, F2, ..., and Fm from the first optical signals S1a, S1b, S1c, S1d, and S1e, and may analyze a correlation between the representative values Ra, Rb, Rc, Rd, and Re of the patterns P and the values F2a, F2b, F2c, F2d, and F2e of the second optical parameter F2. Likewise, the processor 120 may extract values Fma, Fmb, Fmc, Fmd, and Fme of an $m^{th}$ parameter Fm among the plurality of optical parameters F1, F2, ..., and Fm from the first optical signals S1a, S1b, S1c, S1d, and S1e, and may analyze a correlation between the representative values Ra, Rb, Rc, Rd, and Re of the patterns P and the values Fma, Fmb, Fmc, Fmd, and Fme of the $m^{th}$ optical parameter Fm (where, m is an integer equal to or greater than 3).

Under the first optical condition C1, the processor 120 may be configured to analyze the correlation between the representative values Ra, Rb, Rc, Rd, and Re of the patterns P and values of each of the plurality of optical parameters F1, F2, ..., and Fm.

Referring back to FIGS. 2, 6, and 7, the operation S300 of obtaining the optical signals of the patterns P may be repeatedly performed a plurality of times, and the operation S400 of analyzing a correlation between the representative values Ra, Rb, Rc, Rd, and Re of the patterns P and the values of one optical parameter in the optical signals may be repeatedly performed a plurality of times. For example, the correlation between the representative values Ra, Rb, Rc, Rd, and Re of the patterns P and the values of each of the plurality of optical parameters F1, F2, ..., and Fm may be analyzed under the first optical condition C1, and thereafter the inspection system 1000 of FIG. 1 may scan the patterns P under a second optical condition C2. To scan the patterns P under the second optical condition C2 different from the first optical condition C1, the controller 130 of the inspection system 1000 may change operations of one or more of the first and second spatial filters 30 and 90, the spectral filter 40, the first and second polarizer filters 50 and 80, the tube lens 100, and the autofocus 70. The scanning of the patterns P under the second optical condition C2 may obtain second optical signals S2a, S2b, S2c, S2d, and S2e for the patterns P. The second optical signals S2a, S2b, S2c, S2d, and S2e may be obtained from the corresponding patterns P, and may correspond to corresponding optical images of the patterns P under the second optical condition C2. Each of the second optical signals S2a, S2b, S2c, S2d, and S2e may include the plurality of optical parameters F1, F2, ..., and Fm. The plurality of optical parameters F1, F2, ..., and Fm may provide information about the optical image of each of the patterns P. The detector 110 of FIG. 1 may be configured to obtain from the patterns P the second optical signals S2a, S2b, S2c, S2d, and S2e, and the processor 120 of FIG. 1 may be configured to store the second optical signals S2a, S2b, S2c, S2d, and S2e that are obtained by the detector 110.

The processor 120 may be configured to extract values Fma, Fmb, Fmc, Fmd, and Fme of one optical parameter Fm from the second optical signals S2a, S2b, S2c, S2d, and S2e (S410 of FIG. 3), and to analyze a correlation between the representative values Ra, Rb, Rc, Rd, and Re of the patterns P and the values Fma, Fmb, Fmc, Fmd, and Fme of the optical parameter Fm (S420 of FIG. 3). FIG. 7 illustrates an example of the correlation, under the second optical condition C2, between the representative values Ra, Rb, Rc, Rd, and Re of the patterns P and the values Fma, Fmb, Fmc, Fmd, and Fme of the optical parameter Fm. Under the second optical condition C2, the processor 120 may be configured to analyze a correlation between the representative values Ra, Rb, Rc, Rd, and Re of the patterns P and values of each of the plurality of optical parameters F1, F2, ..., and Fm.

After that, the inspection system 1000 of FIG. 1 may scan the patterns P under an $n^{th}$ optical condition Cn (where, n is an integer equal to or greater than 3). To scan the patterns P under the $n^{th}$ optical condition Cn different from the first to $(n-1)^{th}$ optical conditions C1, C2, ..., and Cn-1, the controller 130 of the inspection system 1000 may change operations of one or more of the first and second spatial filters 30 and 90, the spectral filter 40, the first and second polarizer filters 50 and 80, the tube lens 100, and the autofocus 70. The scanning of the patterns P under the $n^{th}$ optical condition Cn may obtain $n^{th}$ optical signals Sna, Snb, Snc, Snd, and Sne for the patterns P. The $n^{th}$ optical signals Sna, Snb, Snc, Snd, and Sne may be obtained from corresponding patterns P, and may correspond to corresponding optical images of the patterns P under the $n^{th}$ optical condition Cn. Each of the $n^{th}$ optical signals Sna, Snb, Snc, Snd, and Sne may include the plurality of optical parameters F1, F2, ..., and Fm. The plurality of optical parameters F1, F2, ..., and Fm may provide information about the optical image of each of the patterns P. The detector 110 of FIG. 1 may be configured to obtain from the patterns P the $n^{th}$ optical signals Sna, Snb, Snc, Snd, and Sne, and the processor 120 of FIG. 1 may be configured to store the $n^{th}$ optical signals Sna, Snb, Snc, Snd, and Sne that are obtained by the detector 110.

The processor 120 may be configured to extract the values Fma, Fmb, Fmc, Fmd, and Fme of the optical parameter Fm from the $n^{th}$ optical signals Sna, Snb, Snc, Snd, and Sne (S410 of FIG. 3), and to analyze a correlation between the representative values Ra, Rb, Rc, Rd, and Re of the patterns P and the values Fma, Fmb, Fmc, Fmd, and Fme of the optical parameter Fm (S420 of FIG. 3). FIG. 7 illustrates an example of the correlation, under the $n^{th}$ optical condition Cn, between the representative values Ra, Rb, Rc, Rd, and Re of the patterns P and the values Fma, Fmb, Fmc, Fmd, and Fme of the optical parameter Fm. Under the $n^{th}$ optical condition Cn, the processor 120 may be configured to analyze a correlation between the representative values Ra, Rb, Rc, Rd, and Re of the patterns P and values of each of the plurality of optical parameters F1, F2, . . . , and Fm.

Figure 8:
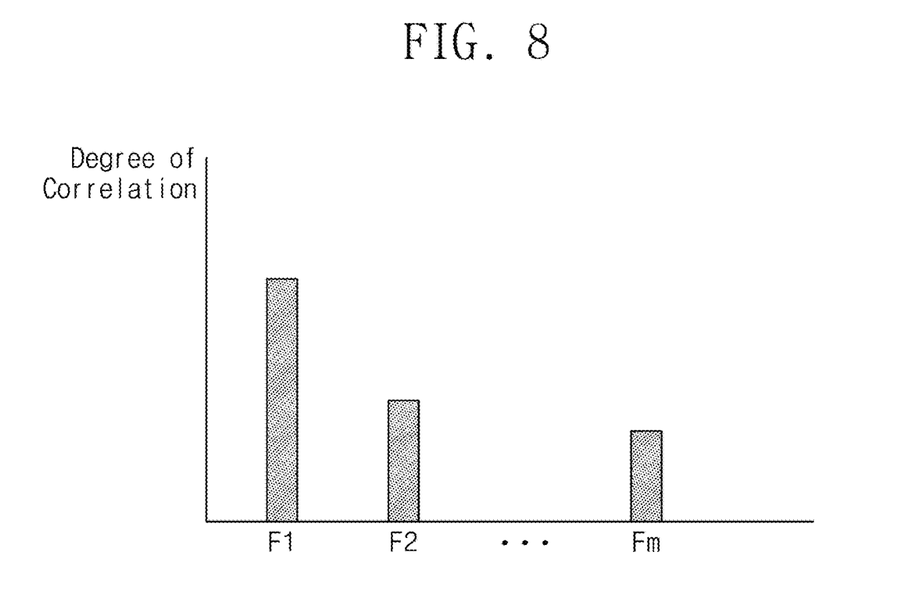
FIG. 8 illustrates a graph showing a degree of correlation between each of a plurality of optical parameters and representative values of patterns shown in FIG. 6.

Referring to FIGS. 2, 7, and 8, a representative optical parameter may be selected from among the plurality of optical parameters F1, F2, . . . , and Fm, and the representative optical parameter may be one of the optical parameters that have a correlation with the representative values Ra, Rb, Rc, Rd, and Re equal to or greater than a threshold correlation, and among the plurality of optical conditions C1, C2, . . . , and Cn, a specific (or optimum) optical condition may be selected (S500). For example, referring to FIG. 8, a degree of correlation between the representative values Ra, Rb, Rc, Rd, and Re and the values F1$a$, F1$b$, F1$c$, F1$d$, and F1$e$ of the first optical parameter F1 may be greater than that between the representative values Ra, Rb, Rc, Rd, and Re and the values F2$a$, F2$b$, F2$c$, F2$d$, and F2$e$ of the second optical parameter F2 and that between the representative values Ra, Rb, Rc, Rd, and Re and the values Fma, Fmb, Fmc, Fmd, and Fme of the $m^{th}$ optical parameter Fm, and in this case the first optical parameter F1 may be selected as the representative optical parameter.

Among the plurality of optical conditions C1, C2, . . . , and Cn, an optical condition having a sensitivity to structural variations of the patterns P equal to or greater than a threshold sensitivity may be selected as the specific optical condition. For example, referring to FIG. 7, when a variation of the representative optical parameter (e.g., the first optical parameter F1) based on the representative values Ra, Rb, Rc, Rd, and Re is greatest under the first optical condition C1 among the plurality of optical conditions C1, C2, . . . , and Cn, the first optical condition C1 may be selected as the specific optical condition. The processor 120 of FIG. 1 may be configured to select the representative optical parameter among the plurality of optical parameters F1, F2, . . . , and Fm, and to select the specific optical condition among the plurality of optical conditions C1, C2, . . . , and Cn.

Referring back to FIGS. 2, 5, and 6, a reference optical signal for a reference pattern RP may be obtained under the specific optical condition (S600). The reference pattern RP may be chosen from the patterns P on the wafer W. Among the patterns P, a pattern P having a value equal to or substantially similar to a desired representative value (e.g., Ra) may be chosen as the reference pattern RP. For example, when the first optical condition C1 is selected as the specific optical condition, the first optical signal S1$a$ may be chosen as the reference optical signal of the reference pattern RP.

A defect of an inspection pattern may be detected based on a reference value of the representative optical parameter for the reference pattern RP and an inspection value of the representative optical parameter for the inspection pattern (S700). In some example embodiments, the defect of the inspection pattern may be detected by comparing the reference value of the representative optical parameter for the reference pattern RP with the inspection value of the representative optical parameter for the inspection pattern.

Figure 4:
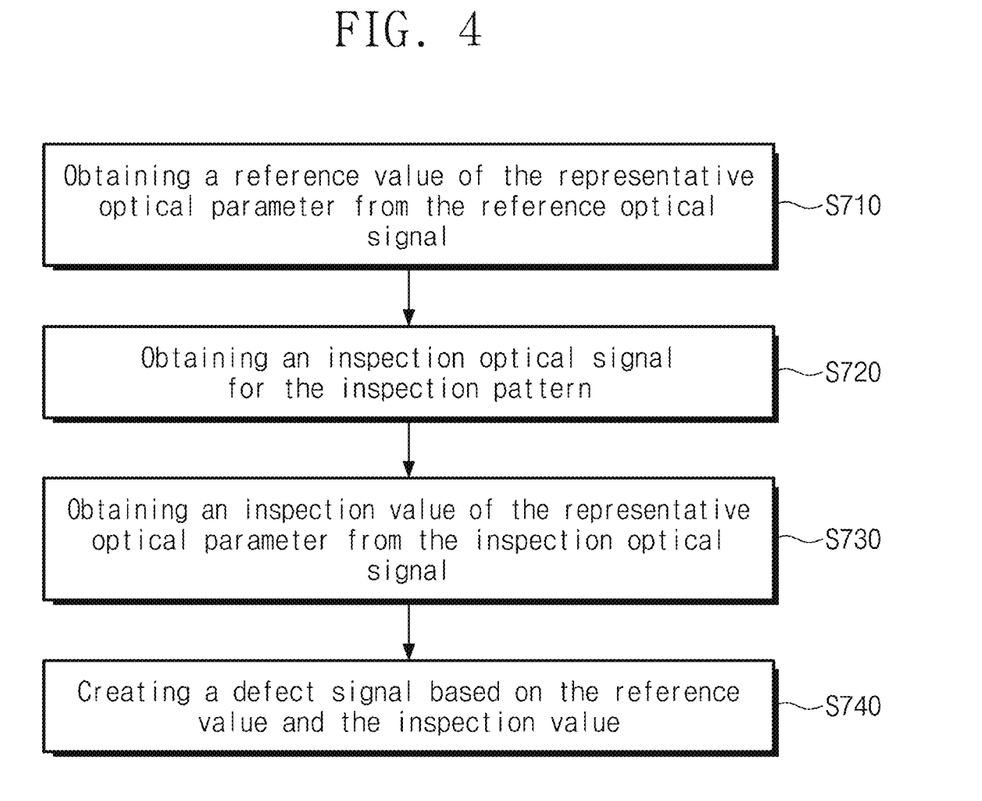
FIG. 4 illustrates a flow chart showing in detail an operation S700 of FIG. 2.
Figure 9:
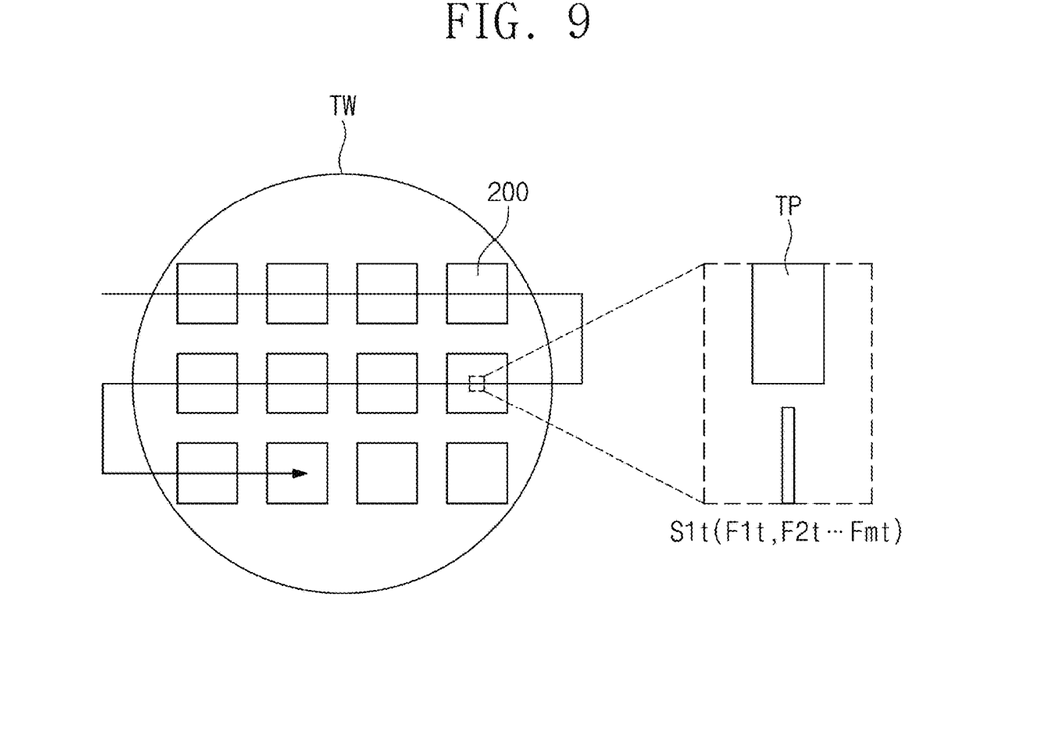

For example, referring to FIGS. 4, 6, and 9, a reference value F1$a$ of the representative optical parameter (e.g., the first optical parameter F1) may be obtained from the reference optical signal (e.g., the first optical signal S1$a$) of the reference pattern RP (S710). The processor 120 of FIG. 1 may be configured to extract the reference value F1$a$ of the representative optical parameter (e.g., the first optical parameter F1) from the reference optical signal (e.g., the first optical signal S1$a$). An inspection wafer (TW) is provided. The inspection wafer TW may include a plurality of dice 200, and each of the plurality of dice 200 may include the inspection pattern TP. The inspection system 1000 of FIG. 1 may scan the inspection pattern TP on each of the plurality of dice 200 under the specific optical condition (e.g., the first optical condition C1). To scan the inspection pattern P under the specific optical condition (e.g., the first optical condition C1), the controller 130 of the inspection system 1000 may control operations of one or more of the first and second spatial filters 30 and 90, the spectral filter 40, the first and second polarizer filters 50 and 80, the tube lens 100, and the autofocus 70.

The scanning of the inspection pattern TP under the specific optical condition (e.g., the first optical condition C1) may obtain an inspection optical signal S1$t$ of the inspection pattern TP. The inspection optical signal S1$t$ may correspond to an optical image of the inspection pattern TP, and include the plurality of optical parameters F1, F2, . . . , and Fm that provide information about the optical image of the inspection pattern TP. An inspection value F1$t$ of the representative optical parameter (e.g., the first optical parameter F1) may be obtained from the inspection optical signal S1$t$ (S730). The processor 120 of FIG. 1 may be configured to extract the inspection value F1$t$ of the representative optical parameter (e.g., F1) from the inspection optical signal S1$t$.

A defect signal may be created based on the inspection value F1$t$ and the reference value F1$a$ of the representative optical parameter (e.g., the first optical parameter F1) (S740). In some example embodiments, the defect signal may be created based on a difference between the inspection value F1$t$ and the reference value F1$a$ of the representative optical parameter (e.g., the first optical parameter F1) (S740). The processor 120 of FIG. 1 may be configured to create the defect signal from the difference between the inspection value F1$t$ and the reference value F1$a$ of the representative optical parameter (e.g., the first optical parameter F1).

Figure 10:
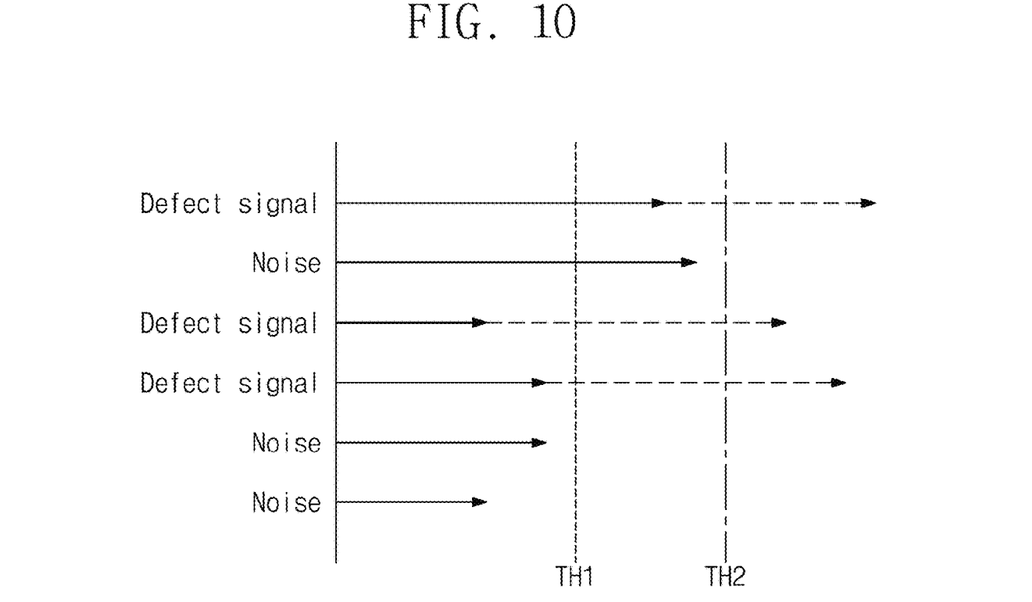
FIG. 10 illustrates a conceptual diagram showing amplification of defect signal(s) in accordance with a method of inspecting a semiconductor wafer according to an example embodiment of the present inventive concepts.

Referring to FIGS. 2, 9, and 10, when the defect signal, for example, corresponding to the difference between the inspection value F1$t$ and the reference value F1$a$ of the representative optical parameter (e.g., the first optical parameter F1) is greater than a threshold TH2, the defect of the inspection pattern TP may be detected. In certain example embodiments, the representative optical parameter may be provided in plural, and a plurality of defect signals may be obtained that correspondingly relate to the plurality of representative parameters. Each of the plurality of defect signals may correspond to, for example, a difference between the inspection value and the reference value of each of the plurality of representative optical parameters. In regard to each of the plurality of dice 200, the processor 120 of FIG. 1 may be configured to create the defect signal from the difference between the inspection value F1$t$ and the reference value F1$a$ of the representative optical parameter (e.g., the first optical parameter F1).

Conventionally, the defect detection on the inspection pattern TP may be performed in such a way that a reference image (or a reference optical signal) of a pre-stored reference pattern is compared with an inspection image (or an inspection optical signal) of the inspection pattern TP. In this case, defect signals and noise signals may be indicated with solid lines in FIG. 10. For example, one of the defect signals may be greater than a threshold TH1, but another of the defect signals may be less than the threshold TH1. Further, one of the noise signals may be greater than the threshold TH1. Therefore, there may be a limitation to detect the defect of the inspection pattern TP.

According to the present inventive concepts, however, among the plurality of optical parameters F1, F2, ..., and Fm, at least one optical parameter having a sensitivity to structural variations of the patterns P equal to or greater than a threshold sensitivity may be selected as the representative optical parameter. For example, a representative optical parameter may be selected from among the plurality of optical parameters F1, F2, ..., and Fm, and the representative optical parameter may be one of the optical parameters that have a correlation with the representative values Ra, Rb, Rc, Rd, and Re of the patterns P equal to or greater than a threshold correlation. The defect detection on the inspection pattern TP may be performed in such a way that the reference value F1a of the representative optical parameter (e.g., the first optical parameter F1) is obtained from the reference optical signal (e.g., the first optical signal S1a) of the reference pattern RP, the inspection value F1t of the representative optical parameter (e.g., the first optical parameter F1) is obtained from the inspection optical signal S1t of the inspection pattern TP, and the inspection value F1t is compared with the reference value F1a of the representative optical parameter (e.g., the first optical parameter F1). The representative optical parameter may have an increased variation caused by structural variations of the patterns P, which result in amplification of the defect signal corresponding to a difference between the inspection value F1t and the reference value F1a of the representative optical parameter (e.g., the first optical parameter F1). The amplified defect signal(s) may be denoted with dotted lines in FIG. 10. According to the present inventive concepts, the defect signal(s) may be selectively amplified by using a difference between the inspection value and the reference value of the representative optical parameter. Further, in this case, a threshold desired for detection of the defect may be increased (TH1→TH2), and accordingly, the noise signals may be easily eliminated. Thus, the defect may be more precisely detected in the inspection pattern TP.

Figure 11:
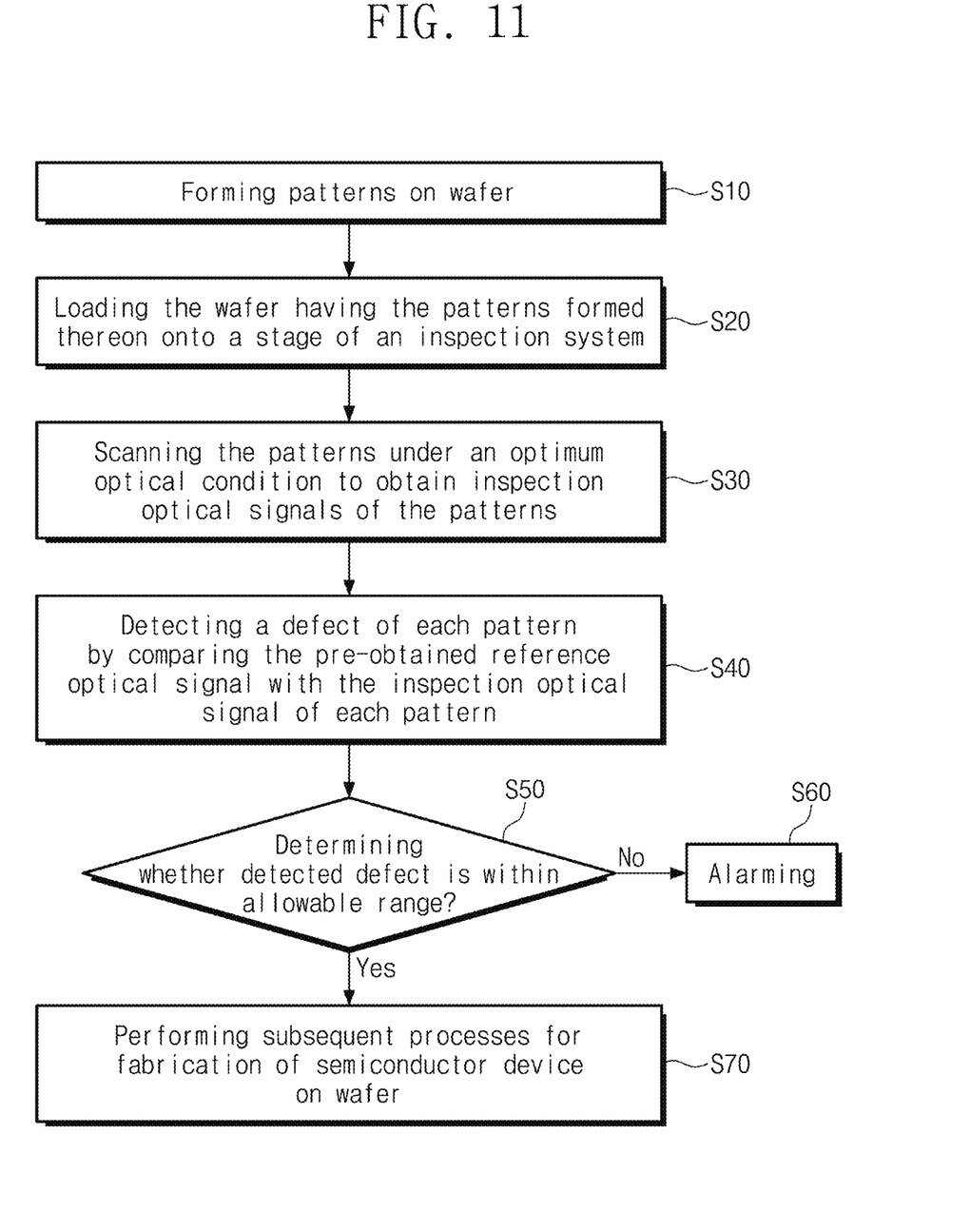
FIG. 11 illustrates a flow chart showing a method of fabricating a semiconductor device using a method of inspecting a semiconductor wafer according to an example embodiment of the present inventive concepts.

FIG. 11 illustrates a flow chart showing a method of fabricating a semiconductor device using a method of inspecting a semiconductor wafer according to an example embodiment of the present inventive concepts.

Referring to FIGS. 9 and 11, inspection patterns TP may be formed on an inspection wafer TW (S10). The inspection wafer TW may include a plurality of dice 200, and the inspection patterns TP may be formed on each of the plurality of dice 200. The inspection wafer TW having the inspection patterns TP formed thereon may be loaded on the stage 10 of the inspection system 1000 shown in FIG. 1 (S20). The inspection system 1000 may scan the inspection patterns TP on the plurality of dice 200 under a specific (or optimum) optical condition. The specific optical condition may be pre-selected by the method of inspecting a semiconductor wafer according to some example embodiments of the present inventive concepts as discussed with reference to FIGS. 2 to 10. To scan the inspection patterns TP under the specific optical condition, the controller 130 of FIG. 1 may control operations of one or more of the first and second spatial filters 30 and 90, the spectral filter 40, the first and second polarizer filters 50 and 80, the tube lens 100, and/or the autofocus 70.

When the inspection patterns TP are scanned under the specific optical condition, inspection optical signals S1t may be obtained from the inspection patterns TP (S30). Each of the inspection optical signal S1t may correspond to an optical image of a corresponding one of the inspection patterns TP, and may include the plurality of optical parameters F1, F2, ..., and Fm that provide information about the optical images of the inspection patterns TP.

A defect of each of the inspection patterns TP may be detected by comparing a reference optical signal with the inspection optical signal S1t of each of the inspection patterns TP (S40). In some example embodiments, a defect of each of the inspection patterns TP may be detected by comparing a reference optical signal with the inspection optical signal S1t of each of the inspection patterns TP (S40). The reference optical signal may be pre-obtained by the method of inspecting a semiconductor wafer according to some example embodiments of the present inventive concepts as discussed with reference to FIGS. 2 to 10, and the processor 120 of FIG. 1 may store the reference optical signal. As discussed with reference to FIGS. 2 to 10, the defect detection on each of the inspection patterns TP may include obtaining a reference value of a representative optical parameter that is pre-selected from the reference optical signal, obtaining an inspection value of the representative optical parameter from the inspection optical signal S1t of each of the inspection patterns TP, and creating a defect signal from a difference between the inspection value and the reference value of the representative optical parameter. The processor 120 of FIG. 1 may be configured to obtain the reference value of the representative optical parameter from the reference optical signal, to obtain the inspection value of the representative optical parameter from the inspection optical signal S1t of each inspection pattern TP, and to create the defect signal from the difference between the inspection value and the reference value of the representative optical signal. When the defect signal of at least one of the inspection patterns TP is greater than a threshold, a defect may be detected from the at least one of the inspection patterns.

It may be determined whether or not a level of the detected defect is within an allowable range (S50). When the level of the detected defect is out of the allowable range, an alarm may be produced (S60). When the level of the detected defect is within the allowable range, subsequent processes may be performed to fabricate a semiconductor device on the inspection wafer TW (S70).

According to the present inventive concepts, the defect signal may be selectively amplified by using a difference between the inspection value and the reference value of the representative optical parameter, and thus defects of the inspection patterns TP may be easily detected. Therefore, it may be possible to more precisely monitor defects of the inspection patterns TP on the inspection wafer TW while fabrication processes are performed to fabricate a semiconductor device, and thus it may be possible to reduce or minimize the occurrence of the defects on the inspection patterns TP during the fabrication of the semiconductor device.

According to the present inventive concepts, a representative optical parameter relatively sensitive to structural variations of patterns may be used to selectively amplify defect signals produced from the inspection patterns. Hence, it may be provided semiconductor wafer inspection method and system capable of more precisely detecting defects of the inspection patterns, and semiconductor device fabrication methods enabling to reduce or minimize the occurrence of defects while semiconductor devices are fabricated.

The aforementioned description provides some example embodiments for explaining the present inventive concepts. Therefore, the present inventive concepts are not limited to the example embodiments described above, and it will be understood by one of ordinary skill in the art that variations in form and detail may be made therein without departing from the spirit and essential features of the present inventive concepts.

What is claimed is:

1. A method of inspecting a semiconductor wafer, the method comprising:
preparing a wafer including a plurality of zones, the wafer including a plurality of patterns on the plurality of zones, respectively;
obtaining a plurality of representative values for the patterns, respectively;
scanning the patterns under a first optical condition to obtain a plurality of first optical signals for the patterns, respectively, each of the first optical signals including a plurality of optical parameters;
selecting a representative optical parameter among the optical parameters, the representative optical parameter being one of the optical parameters that has a correlation with the representative values equal to or greater than a threshold correlation;
obtaining a reference value of the representative optical parameter for a reference pattern; and
obtaining a defect of an inspection pattern by comparing the reference value with an inspection value of the representative optical parameter for the inspection pattern.

2. The method of claim 1, wherein the representative values relate to physical factors of the patterns or results of an electrical die sorting (EDS) test on semiconductor chips including the patterns.

3. The method of claim 1, wherein the optical parameters provide information about an optical image of each of the patterns.

4. The method of claim 1, wherein the selecting comprises:
obtaining a plurality of first values of a first optical parameter from respective ones of first optical signals;
analyzing a first correlation between the first values of the first optical parameter and the representative values;
obtaining a plurality of second values of a second optical parameter from respective ones of the first optical signals;
analyzing a second correlation between the second values of the second optical parameter and the representative values; and
selecting the first optical parameter as the representative optical parameter in response to the first correlation being greater than the second correlation.

5. The method of claim 1, wherein
the obtaining a reference value comprises,
scanning the reference pattern under a specific optical condition to obtain a reference optical signal for the reference pattern, and
obtaining the reference value of the representative optical parameter from the reference optical signal, and
the obtaining a defect comprises,
scanning the inspection pattern under the specific optical condition to obtain an inspection optical signal for the inspection pattern,
obtaining the inspection value of the representative optical parameter from the inspection optical signal, and
creating a defect signal by comparing the inspection value and the reference value of the representative optical parameter.

6. The method of claim 1, further comprising:
selecting one of the patterns having a representative value equal to or substantially similar to a desired representative value as the reference pattern.

7. The method of claim 1, further comprising:
scanning the patterns under a second optical condition to obtain a plurality of second optical signals for the patterns, respectively, the second optical condition being different from the first optical condition,
wherein each of the second optical signals includes the plurality of optical parameters.

8. The method of claim 7, further comprising:
analyzing a first correlation between the representative values for the patterns and first values of a specific optical parameter in the first optical signals; and
analyzing a second correlation between the representative values of the patterns and second values of the specific optical parameter in the second optical signals.

9. The method of claim 7, further comprising:
selecting a specific optical condition from among the first optical condition and the second optical condition,
wherein the obtaining includes,
scanning the reference pattern under the specific optical condition to obtain a reference optical signal for the reference pattern,
obtaining the reference value of the representative optical parameter from the reference optical signal,
scanning the inspection pattern under the specific optical condition to obtain an inspection optical signal for the inspection pattern,
obtaining the inspection value of the representative optical parameter from the inspection optical signal, and
creating a defect signal by comparing the inspection value and the reference value of the representative optical parameter.

10. The method of claim 1, further comprising:
determining whether a level of the defect is within an allowable range; and
performing subsequent processes to fabricate a semiconductor device on an inspection wafer with the inspection pattern formed thereon, when the level of the defect is within the allowable range.

11. A semiconductor wafer inspection system, comprising:
a stage configured to load a wafer including a plurality of patterns;
a light source configured to emit an incident light on the wafer;
a detector configured to detect a reflected light from the wafer; and
a processor configured to store and process an optical signal of the reflected light,
wherein the optical signal includes a plurality of optical parameters, and
wherein the processor is configured to store a plurality of representative values for the patterns and select one of the optical parameters as a representative optical parameter, the representative optical parameter being one of the optical parameters that has a correlation with the representative values equal to or greater than a threshold correlation.

12. The system of claim 11, wherein the representative values relate to size, shape, and/or material of the patterns or yield data on a plurality of semiconductor chips including the patterns.

13. The system of claim 11, wherein the optical parameters provide information about an optical image of each of the patterns.

14. The system of claim 11, further comprising:
a controller configured to
change an optical condition of the incident light and the reflected light, and
scan the patterns on the wafer under a first optical condition,
wherein the detector is further configured to obtain a plurality of first optical signals from corresponding ones of the patterns scanned under the first optical condition, respectively,
the processor is further configured to store the first optical signals, and
each of the first optical signals includes the plurality of optical parameters.

15. The system of claim 14, wherein the processor is further configured to,
obtain a plurality of first values of a first optical parameter from respective ones of first optical signals,
analyze a first correlation between the first values of the first optical parameter and the representative values,
obtain a plurality of second values of a second optical parameter from respective ones of first optical signals,
analyze a second correlation between the second values of the second optical parameter and the representative values, and
select the first optical parameter as the representative optical parameter in response to the first correlation being greater than the second correlation.

16. The system of claim 14, wherein
the controller is further configured to scan the patterns on the wafer under a second optical condition different from the first optical condition,
the detector is further configured to obtain a plurality of second optical signals from the patterns scanned under the second optical condition,
the processor is further configured to store the second optical signals, and
each of the second optical signals includes the plurality of optical parameters.

17. The system of claim 16, wherein the processor is further configured to,
analyze a first correlation between the representative values for the patterns and a plurality of first values of a specific optical parameter in the first optical signals, and
analyze a second correlation between the representative values for the patterns and a plurality of second values of the specific optical parameter in the second optical signals.

18. The system of claim 16, wherein the processor is further configured to select a specific optical condition from among the first optical condition and the second optical condition.

19. A method of fabricating a semiconductor device, the method comprising:
forming a plurality of patterns on a wafer;
loading the wafer having the patterns formed thereon onto a stage of an inspection system;
scanning the patterns under a specific optical condition to obtain a plurality of inspection optical signals of the patterns;
detecting a defect of each of the patterns based on a reference optical signal and an inspection optical signal, from among the inspection optical signals, that corresponds to the each of the patterns;
determining whether or not a level of the detected defect is within an allowable range; and
performing subsequent processes to fabricate the semiconductor device on the wafer, in response to the level of the detected defect being within the allowable range,
wherein each of the reference optical signal and the inspection optical signals includes a plurality of optical parameters, and
wherein the detecting comprises,
obtaining an inspection value of a representative optical parameter from the inspection optical signal of each of the patterns, the representative optical parameter being one pre-selected from the optical parameters,
obtaining a reference value of the representative optical parameter from the reference optical signal, and
creating a defect signal by comparing the inspection value and the reference value.

20. The method of claim 19, further comprising:
obtaining the reference optical signal by scanning a pre-selected reference pattern under the specific optical condition.

* * * * *